(12) United States Patent
Norouzpourshirazi

(10) Patent No.: US 12,726,163 B1
(45) Date of Patent: Sep. 1, 2026

(54) CHARGE INJECTION-RELATED AND SWITCHING ERROR-RELATED OFFSET REDUCTION BY LOCAL CHOPPING OF SWITCHED-CAPACITOR CIRCUITS

(71) Applicant: CIRRUS LOGIC INTERNATIONAL SEMICONDUCTOR LTD., Edinburgh (GB)

(72) Inventor: Arashk Norouzpourshirazi, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 741 days.

(21) Appl. No.: 18/067,712

(22) Filed: Dec. 18, 2022

(51) Int. Cl.
*H03F 3/45* (2006.01)
*H03F 1/32* (2006.01)

(52) U.S. Cl.
CPC ....... *H03F 3/45977* (2013.01); *H03F 1/3211* (2013.01); *H03F 3/45475* (2013.01);
(Continued)

(58) Field of Classification Search
CPC ............. H03F 3/45977; H03F 3/45475; H03F 2200/375; H03F 2203/45514;
(Continued)

(56) References Cited

U.S. PATENT DOCUMENTS 5,739,720 A * 4/1998 Lee ..................... H03F 3/45968 330/9
6,639,532 B1 10/2003 Liu et al.
(Continued)

FOREIGN PATENT DOCUMENTS

JP 3706643 B2 * 10/2005 ............ H03M 3/342
WO WO-2017037744 A2 * 3/2017 ............. H03M 3/34

OTHER PUBLICATIONS

Bakker, et al., "A CMOS Nested-Chopper Instrumentation Amplifier with 100nV Offset", IEEE Journal of Solid- State Circuits, Dec. 2000, pp. 1877-1883, vol. 35, No. 12, IEEE Press, Piscataway NJ. (pp. 1-7 in pdf).

(Continued)

*Primary Examiner* — Andrea Lindgren Baltzell
*Assistant Examiner* — Lance Torbjorn Bartol
(74) *Attorney, Agent, or Firm* — Andrew M. Harris; Mitch Harris, Atty at Law, LLC

(57) ABSTRACT

Switched-capacitor circuits having reduced charge injection offset are implemented by differentially interchanging pairs of charge transfer switches of the switched-capacitor circuit at a frequency other than the sampling frequency of the switched-capacitor circuit, thereby chopping the switch signal paths. The circuits include a pair of capacitors, a switching circuit that alternatively charges the pair of capacitors from a differential input and transfers the charge from the pair of capacitors, according to corresponding phases of a reference sampling clock. The circuits also include a chopping circuit that alternates differential connections to at least some of the switches. The chopping circuit is operated at a chopping frequency, so that DC offset caused by charge-injection in the switching circuit due to the reference sampling clock coupling through the switches of the switching circuit is removed by modulating the charge injection of the switching circuit away from DC.

23 Claims, 9 Drawing Sheets

(52) U.S. Cl.
CPC .. *H03F 2200/271* (2013.01); *H03F 2200/375* (2013.01); *H03F 2203/45514* (2013.01); *H03F 2203/45551* (2013.01)

(58) Field of Classification Search
CPC ..... H03F 2203/45551; H03F 2200/271; H03F 1/3211
USPC .............................................................. 330/9
See application file for complete search history.

(56) References Cited

U.S. PATENT DOCUMENTS

| | | | | |
|---|---|---|---|---|
| 7,667,501 | B2 * | 2/2010 | Surendranath | G11C 27/026 327/554 |
| 10,079,577 | B2 * | 9/2018 | Wang | H03F 3/387 |
| 2013/0335131 | A1 * | 12/2013 | Ceballos | G06G 7/18 327/337 |
| 2023/0013459 | A1 * | 1/2023 | Michel | G06N 3/0499 |

OTHER PUBLICATIONS

Xu, et al., "A +/−4-A High Side Current Sensor With 0.9% Gain Error from −40° C. to 85° C. Using an Analog Temperature Compensation Technique", IEEE Journal of Solid-State Circuits, Dec. 2018, pp. 3368-3376, vol. 53, No. 12, IEEE Press, Piscataway NJ. (pp. 1-9 in pdf).

* cited by examiner

CHARGE INJECTION-RELATED AND SWITCHING ERROR-RELATED OFFSET REDUCTION BY LOCAL CHOPPING OF SWITCHED-CAPACITOR CIRCUITS

BACKGROUND

1. Field of Disclosure

The field of representative embodiments of this disclosure relates to switched-capacitor circuits, and in particular to techniques for reducing offset due to asymmetric charge injection and switching error by locally chopping the switched signal paths within the switched-capacitor circuits.

2. Background

Switched-capacitor circuits are commonly used in analog signal processing circuits, such as analog filters, in which resistances can be replaced by switched capacitors, as well as in data converters, in which resistive ladders may be replaced by switches and capacitors. In either instance, use of switched-capacitor circuits provides circuit stability and reduces variation of manufactured components, in particular when circuits can be designed to depend on capacitor ratios, rather than absolute capacitance values.

One drawback to switched-capacitor implementation of analog circuits is a requirement for operation at a switching frequency significantly greater than the bandwidth of an implemented circuit. The switching frequency must not only be greater than the Nyquist rate, i.e., greater than twice the maximum frequency in the bandwidth of operation of the circuit, but also the switching frequency must often be even greater than the Nyquist rate. A high switching rate is needed in order to provide reasonably low resistance values while maintaining a small area for the individual capacitors, since the value of the resistance of a switched-capacitor is inversely proportional to both the capacitance and the switching rate, resulting in a tradeoff-between switching rate and capacitor area for a given resistance value.

Increasing the switching rate of a switched-capacitor circuit has another drawback: the edges of the control signals operating the switching transistors couple from the gates of the transistors to the channel, with any asymmetry in the charge-injection or any asymmetric error in switching edge timing causing a direct-current (DC) offset to accumulate on the capacitors. The charge-injection amount is related to the switching control waveform voltage, rise-time/fall-time and asymmetry between the switching control waveform edges and the asymmetry of the devices themselves. As the switching frequency is increased, the offset on the capacitors due to charge injection asymmetry also increases, since more edges occur in a given time interval.

Therefore, it would be advantageous to reduce the impact of charge injection and switching error asymmetry in switched-capacitor circuits.

SUMMARY

Impact of charge injection in switched-capacitor circuit is accomplished in switched-capacitor circuits and their methods of operation according to embodiments of the present disclosure.

The switched-capacitor circuits are differential switched-capacitor circuits that, in some embodiments, include one or more pairs of charge transfer switches operating at a sampling frequency, and an associated one or more pairs of capacitors coupled to the charge transfer switches by a corresponding one or more quads of chopping switches. At least one of the pairs of charge transfer switches have connections differentially interchanged by the corresponding quad of chopping switches operating at a frequency different from the sampling frequency to modulate charge injection through the charge transfer switches away from DC.

In some embodiments, a differential switched-capacitor circuit may include a pair of capacitors, a switching circuit that alternatively charges the pair of capacitors from a differential input in a first phase of a reference sampling clock and transfers charge from the pair of capacitors in a second phase of the reference sampling clock, and a chopping circuit that alternates connections to at least some of the switches of the switching circuit between differential pairs of signals through the switching circuit. The chopping circuit may be operated at a chopping frequency, so that DC offset caused by charge-injection in the switching circuit due to the reference sampling clock coupling through the switches of the switching circuit is removed by modulating the charge injection of the switching circuit away from direct-current (DC).

The summary above is provided for brief explanation and does not restrict the scope of the claims. The description below sets forth example embodiments according to this disclosure. Further embodiments and implementations will be apparent to those having ordinary skill in the art. Persons having ordinary skill in the art will recognize that various equivalent techniques may be applied in lieu of, or in conjunction with, the embodiments discussed below, and all such equivalents are encompassed by the present disclosure.

DESCRIPTION OF ILLUSTRATIVE EMBODIMENT

The present disclosure encompasses switched-capacitor circuits that include chopping of pairs of switch paths, rather than chopping of differential signal paths, in order to reduce DC offset that may accumulate due to asymmetry in switching devices or switch control signal due to asymmetric charge injection/capacitive coupling through the switching devices. The switched-capacitor circuits are differential switched-capacitor circuits that, in some embodiments, include one or more pairs of charge transfer switches operating at a sampling frequency, and an associated one or more pairs of capacitors coupled to the charge transfer switches by a corresponding one or more quads of chopping switches. At least one of the pairs of charge transfer switches may have connections differentially interchanged by the corresponding quad of chopping switches operating at a frequency different from the sampling frequency to modulate charge injection through the charge transfer switches away from DC.

Figure 1A:
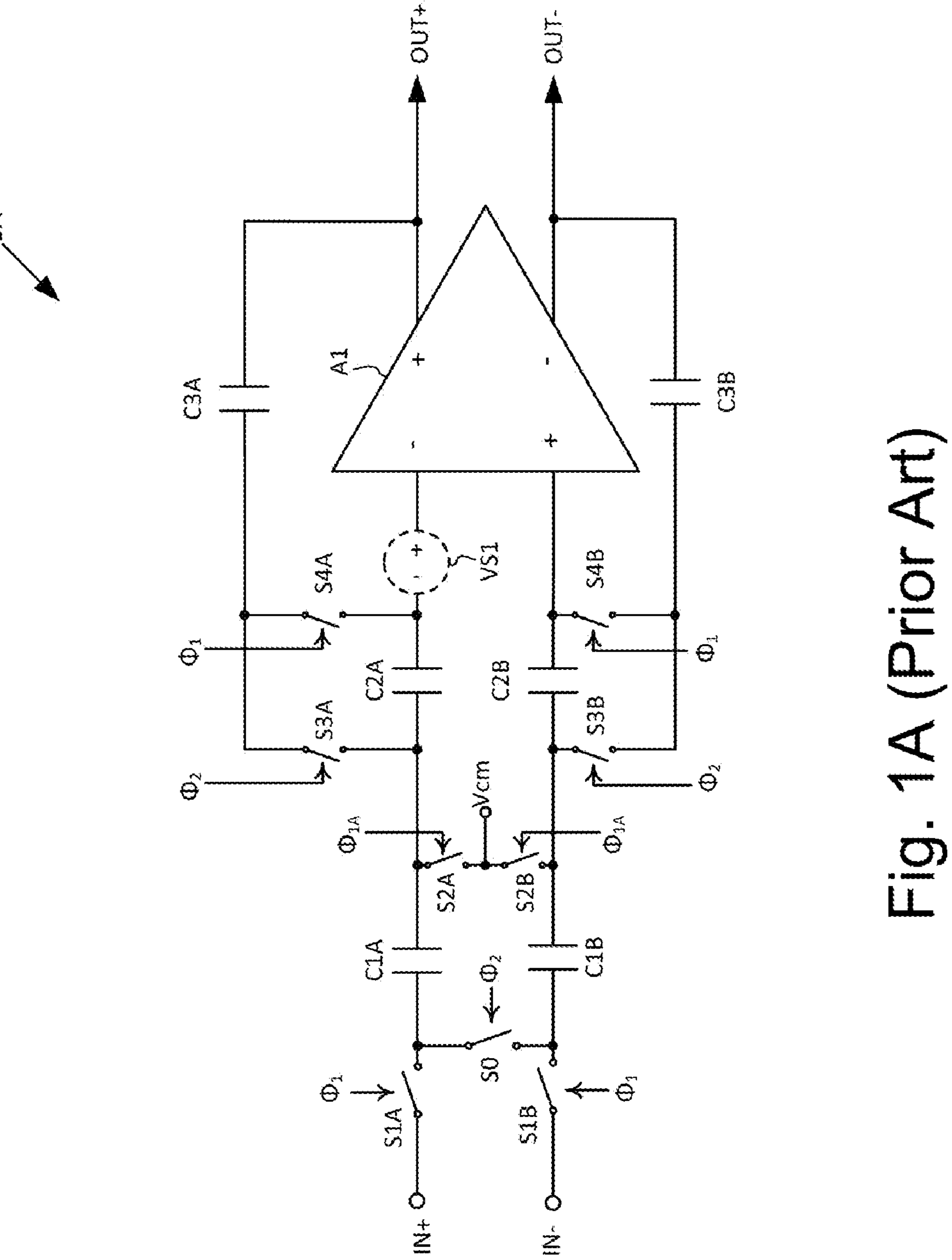
FIG. 1A is a schematic diagram of a prior art correlated double-sampling switched-capacitor integrator circuit 5A.

Referring now to FIG. 1A, a schematic diagram of a prior art correlated double-sampling switched-capacitor integrator circuit 5A is shown. Switches S1A, S1B sample a differential input signal provided across input terminals IN+, IN− during a first phase $\Phi_1$ of a sampling clock, charging a pair of input sampling capacitors C1A, C1B. During a first portion $\Phi_{1A}$ of first phase $\Phi_1$, the terminals of input sampling capacitors C1A, C1B opposite the terminals connected to switches S1A, S1B are coupled via another pair of switches S2A, S2B, to a common-mode reference voltage $V_{cm}$. During a remaining portion of first phase $\Phi_1$, switches S2A, S2B are opened and a series combination of input sampling capacitors C1A, C1B and another pair of input sampling capacitors C2A, C2B, which may be referred to as correlated double-sampling (CDS) capacitors is coupled between input terminals IN+, IN− and the summing nodes of a fully-differential amplifier A1. The terminals of input sampling capacitors C2A, C2B opposite their connections to fully-differential amplifier A1 are coupled to common-mode reference voltage $V_{cm}$ during the first portion $\Phi_{1A}$ of first phase $\Phi_1$, so that any charge transferred to capacitors C2A, C2B will be due to amplifier offset voltage, represented by voltage source VS1, and flicker input noise from amplifier A1. A pair of switches S4A, S4B couple the input terminals of amplifier A1 with a pair of feedback capacitors C3A, C3B during phase $\Phi_1$. Since input sampling capacitors C1A, C1B are charged to the common-mode referenced differential input voltage and capacitors C2A, C2B are charged to the amplifier offset voltage VS1 and flicker input noise from amplifier A1, at the end of first portion $\Phi_{1A}$ of first phase $\Phi_1$, during the remainder of first phase $\Phi_1$, the voltages on input sampling capacitors C1A, C1B and C2A, C2B remain the same. During a second sampling clock phase $\Phi_2$, capacitors C2A, C2B are coupled in the feedback paths of amplifier A1, in series connection with feedback capacitors C3A, C3B by a pair of switches S3A, S3B, which subtracts the amplifier offset voltage VS1 and the previously sampled flicker noise amount from the differential voltage at the inputs of amplifier A1, which is equal to the amplifier offset voltage VS1 plus noise, added to the sampled differential input voltage across input sampling capacitors C1A, C1B, which are coupled together in series by a switch S0.

The above description disregards capacitor charge differences due to switch asymmetry and charge injection due to the switching transitions on switches S1A, S1B switches S2A, S2B, switches S3A, S3B, and switches S4A, S4B. Ideally, charge injection cancels due to charge injection of opposite polarity as a switch opens and closes. However, the asymmetries, as pointed out above, generally leads to an accumulated offset across the differential output OUT+, OUT− of integrator circuit 5A due to charge injection. One mechanism that has been implemented to minimize the residual offset due to charge injection asymmetry is a nested chopping scheme that chops signal paths within a switched-capacitor integrator at a low frequency.

Figure 1B:
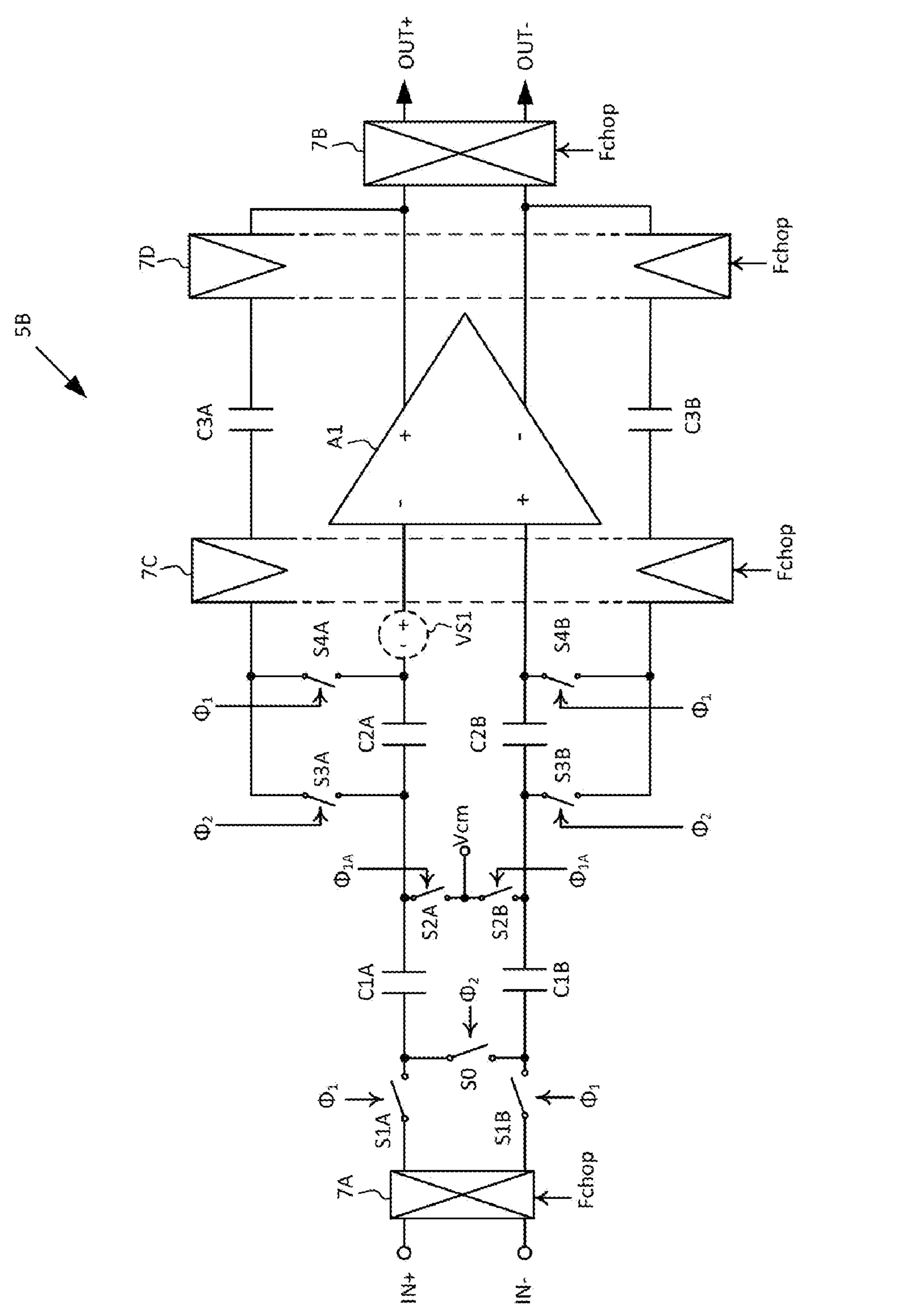
FIG. 1B is a schematic diagram of a prior art correlated double-sampling switched-capacitor integrator circuit 5B with nested chopping circuits included.
Figure 2A:
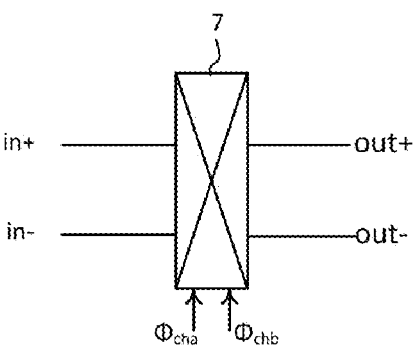
FIG. 2A is a block diagram of an example chopping circuit 7 as used in the drawings for simplification.
Figure 2B:
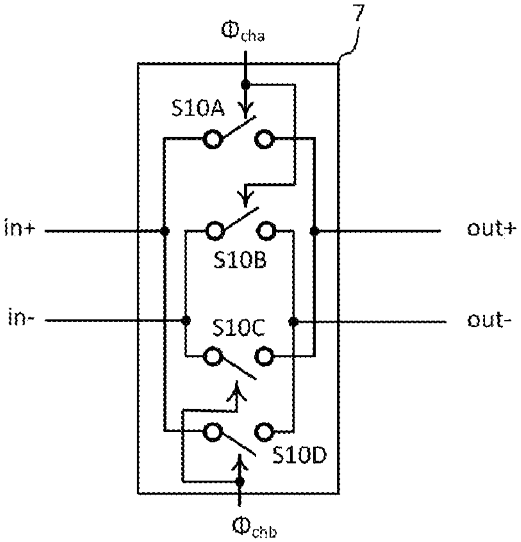
FIG. 2B is a schematic diagram of example chopping circuit 7.

Referring now to FIG. 1B, a schematic diagram of a prior art correlated double-sampling switched-capacitor integrator circuit 5B is shown, with nested chopping circuits included. Integrator circuit 5B is similar to integrator circuit 5A of FIG. 1A, so only differences between them will be described below. Integrator circuit 5B includes a pair of choppers (or chopping circuits) 7A, 7B that differentially interchange the input signal paths and the output signal paths of integrator circuit 5B, so that, on average, any offset is canceled at both the input and the output of integrator 5B. Another pair of choppers 7C and 7D interchange the top and bottom plates of feedback capacitors C3A and C3B, respectively. Referring additionally to FIG. 2A and FIG. 2B, details of an example chopper circuit 7 are shown, which may be used to implement choppers in prior art switched-capacitor integrator circuit 5B, as well as choppers included in embodiments of the disclosure as described below. FIG. 2A is a block diagram showing the symbol used for chopper circuit 7 as used in the Figures disclosed herein, and which receives a differential pair of input signals in+, in−, which are connected or cross-connected to a differential pair of output signals out+, out−, according to non-overlapping chopping clock signals $\Phi_{cha}$, $\Phi_{chb}$, that represent alternating clock phases of a chopping clock. FIG. 2B is a schematic diagram of example chopping circuit (or "chopper") 7. A pair of switches S10A, S10B activated by clock signal $\Phi_{cha}$ connect input signal in+ and input signal in− to output signal out+, and output signal out−, respectively. A pair of switches S10C, S10D activated by clock signal $\Phi_{chb}$ connect input signal in+ and input signal in− to output signal out−, and output signal out+, respectively, reversing the polarity of the differential signal provided by output signals out+, out− with respect to input signals in+, in−, in other terms cross-connecting the differential signal paths. Chopper 7 differentially interchanges the connections between input signals in+, in− and output signals out+, out−, which changes the polarity of the differential signal path and distributes any common-mode voltage offset, e.g., offset due to charge injection and other source, and low frequency noise, e.g., flicker noise, present on input signals in+, in− across both of output signals out+, out− for equal periods, so that the offset and low-frequency noise is removed on average. However, since the differential signal paths are chopped in integrator 5B, the result is a chopped signal, which has frequency components related to the chopping frequency, the sampling frequency and also the baseband signal components. If the next stage in a system is another integrator, chopping of the differential signal paths may be sufficient, but if not, the chopped signal must generally be restored by filtering, or other means. As mentioned above, the present disclosure encompasses switched-capacitor circuits that include chopping of pairs of switching paths, rather than chopping of differential signal paths. Since only the switching paths are chopped, the chopping frequency components are removed along with the sampling frequency components by the integrator.

Figure 3:
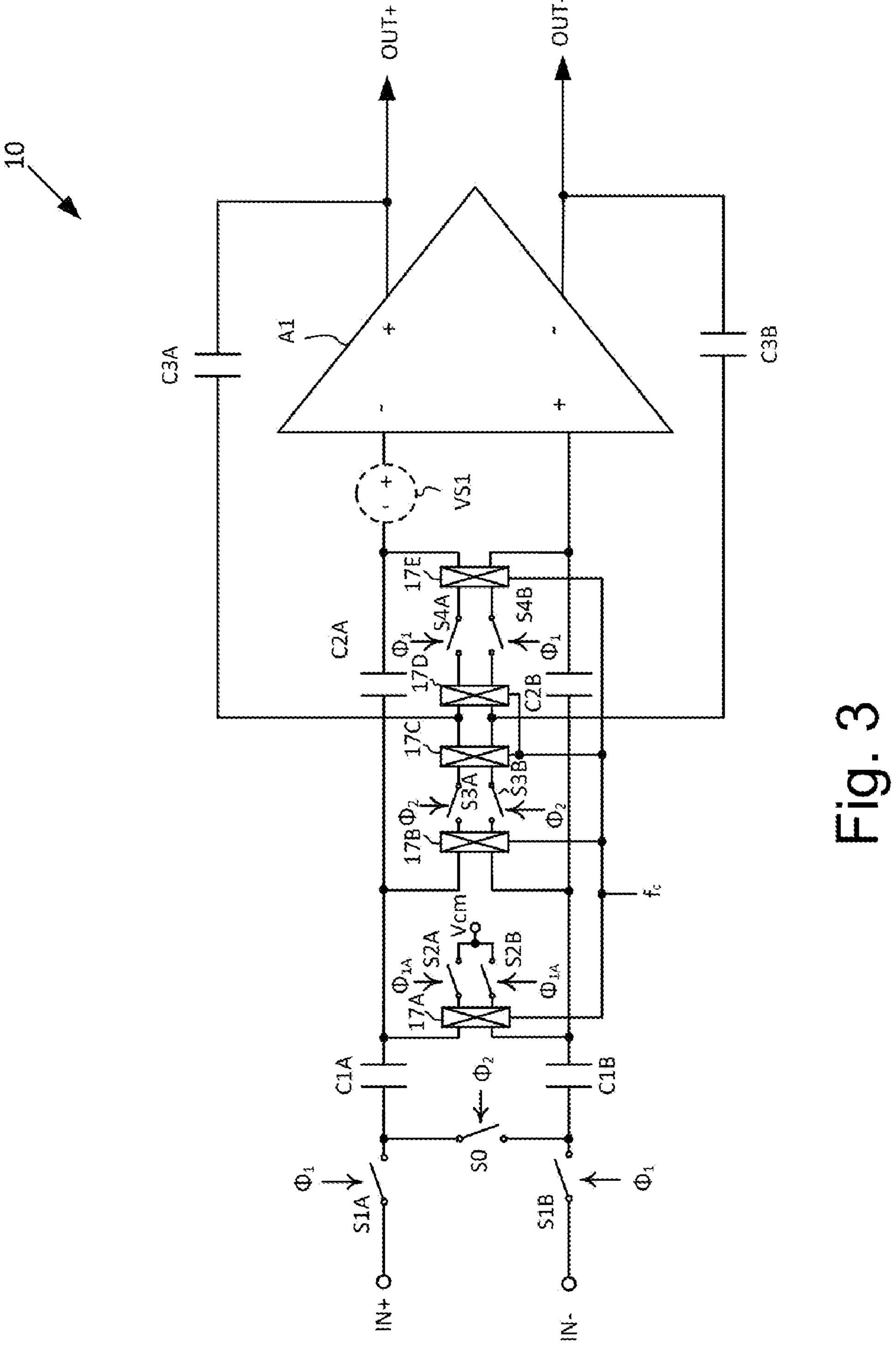
FIG. 3 is a simplified schematic diagram showing an example correlated double-sampling switched-capacitor integrator circuit 10, in accordance with an embodiment of the disclosure.
Figure 5:
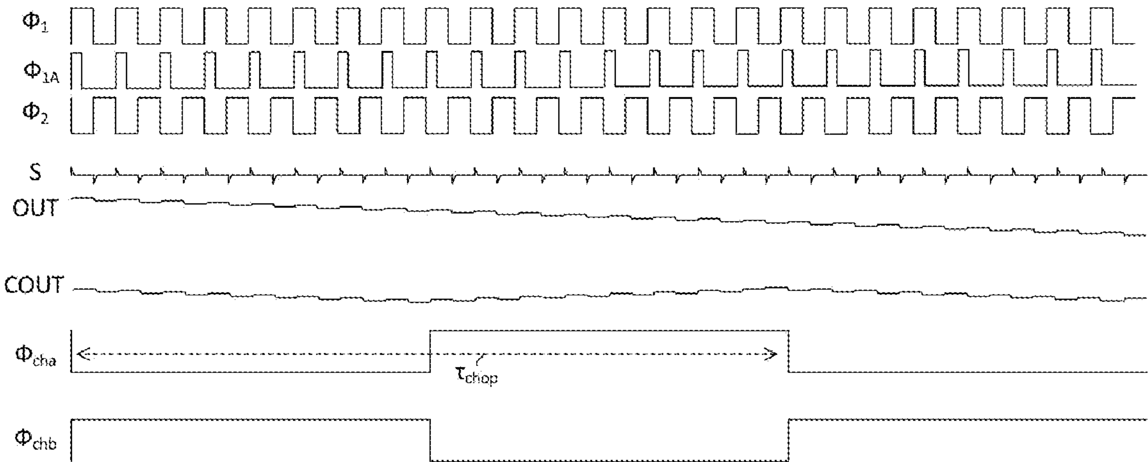
FIG. 5 is a timing diagram depicting example signal waveforms in example switched-capacitor integrator circuit 10 of FIG. 3 and example switched-capacitor integrator circuit 20 of FIG. 4, in accordance with an embodiment of the disclosure.

Referring now to FIG. 3, a simplified schematic diagram of an example correlated double-sampling switched-capacitor integrator circuit 10 is shown, in accordance with an embodiment of the disclosure. While integrator circuit 10 is configured as an integrator, the techniques described below apply to other switched-capacitor circuit topologies, such as switched-capacitor gain stages more generally, e.g., by replacing the feedback capacitors of circuits with resistors, or with switched-capacitor implementations of resistors. Signal flow through, and component designations of, example switched-capacitor integrator circuit 10 are similar to prior art correlated double-sampling switched-capacitor integrator circuit 5A of FIG. 1A, except that a pair of choppers 17B, 17C is included to chop the signals conducted through switches S3A, S3B and another pair of choppers 17D, 17E is included to chop the signals conducted through switches S4A, S4B. Only a single chopper 17A is needed to chop the signals conducted through switches S2A, S2B, since both of the individual switching paths constituting the differential signal path at that point in the circuit connect to common-mode reference voltage $V_{cm}$, so offset due to charge injection asymmetry in switches S2A, S2B is chopped between both of the individual signal paths to S2A, S2B from capacitors C1A and C1B, without requiring a chopper between common-mode reference voltage $V_{cm}$ and switches S2A, S2B. However, charge injection asymmetry contributions may be particularly high for switches S2A, S2B, and the effects of their charge injection asymmetry may also be reduced by the chopping techniques disclosed herein. Choppers 17A-17E are generally operated by two non-overlapping clock phases as illustrated in FIG. 2A and FIG. 2B, but are depicted as a single clock signal $f_c$ for simplicity of illustration. Referring additionally to FIG. 5, a timing diagram depicting example signal waveforms in example switched-capacitor integrator circuit 10 is shown, in accordance with an embodiment of the disclosure. The relationship between sampling clock phases $\Phi_1$ $\Phi_{1A}$ and $\Phi_2$ are shown, along with chopping clock signals $\Phi_{cha}$, $\Phi_{chb}$, which in the illustrated timing diagram have a chopping clock frequency $f_c$ that is one-eighth of the frequency of the sampling clock. A signal S illustrates a voltage due to asymmetric charge injection as present on one of the inputs of amplifier A1. In practice, the total asymmetric charge injection will be a composite of charge injection from all of switches S2A, S2B, S3A, S3B, S4A and S4B. Signal OUT represents the differential output voltage across terminals OUT+, OUT− with choppers 17A-17E disabled or omitted, showing a ramp due to asymmetry of the voltage due to charge injection represented by signal S that may eventually saturate example switched-capacitor integrator circuit 10 by reaching an output voltage limit of amplifier A1. Signal COUT represents the same differential output voltage with choppers 17A-17E operating at a chopping period $\tau_{chop}=1/f_c$. As illustrated in FIG. 5, the ramping in signal COUT due to the asymmetric charge injection of signal S changes direction at every half chopping period, so that the net result of the asymmetric charge injection averages to zero and has a reduced amplitude due to the ratio of sampling frequency $f_s$ to chopping frequency $f_c$. While the examples illustrated herein use a low-frequency chopping clock that is, for example, 100× lower in frequency than a sampling frequency $f_s$ at which the switched-capacitor circuit samples and processes the differential input signal, it is also possible to use a higher frequency or a frequency that is ratiometrically closer to sampling frequency $f_s$ in order to shift the offset due to asymmetric charge injections in the switching network to another frequency range that is not problematic to operation of the circuit.

Figure 6:
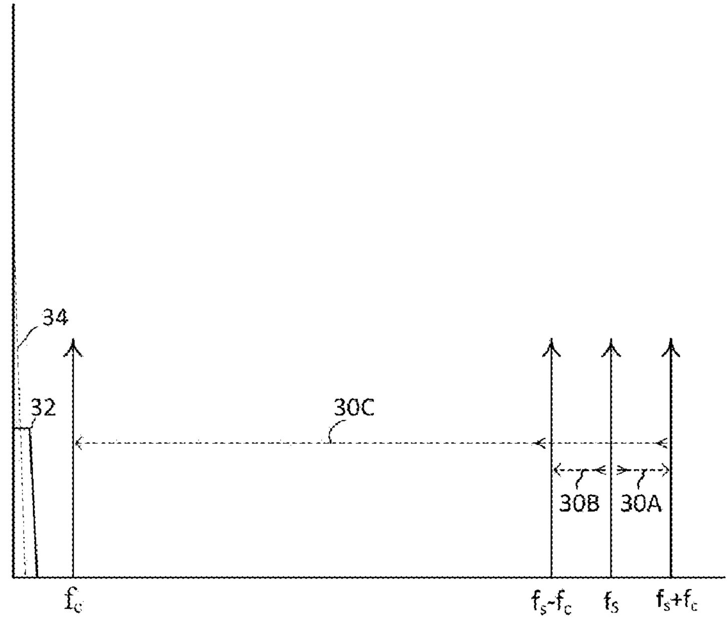
FIG. 6 depicts an example spectral diagram depicting frequency components of signals in example switched-capacitor integrator circuit 10 of FIG. 3 and example switched-capacitor integrator circuit 20 of FIG. 4, in accordance with an embodiment of the disclosure.

Referring additionally to FIG. 6, an example spectral diagram depicting frequency components of signals in example switched-capacitor integrator circuit 10 of FIG. 3 is shown, in accordance with an embodiment of the disclosure. A baseband signal 32, which may be a desired DC value plus noise, is represented under an integrator response curve 34, which attenuates frequencies above DC according to a relationship 1/f. Any asymmetric charge injection voltage at the inputs of integrator 10 appear at sampling frequency $f_s$ (and multiples above, which are not shown). Arrows 30A and 30B illustrate a shift of the energy of the voltage due to charge injection to frequencies $f_s+f_c$ and $f_s-f_c$ by the chopping action of choppers 17A-17E. Arrow 30C illustrates the shift of the energy at $f_s+f_c$ and $f_s-f_c$ due to the sampling action of switches of the switched-capacitor to chopping frequency $f_c$, while the energy from the baseband signal/noise at sampling frequency $f_s$ is modulated to baseband. Integrator response 34 greatly attenuates energy at frequency $f_c$ at the output of integrator 10, which removes the offset due to asymmetric charge injection while retaining the baseband signal for integration by integrator 10. The only remaining asymmetric charge injection will be due to switches in choppers 17A-17E, themselves, which has much lower energy due to the less frequent edges at chopping frequency $f_c$, according to the ratio of chopping frequency $f_c$ to sampling frequency $f_s$.

Figure 4:
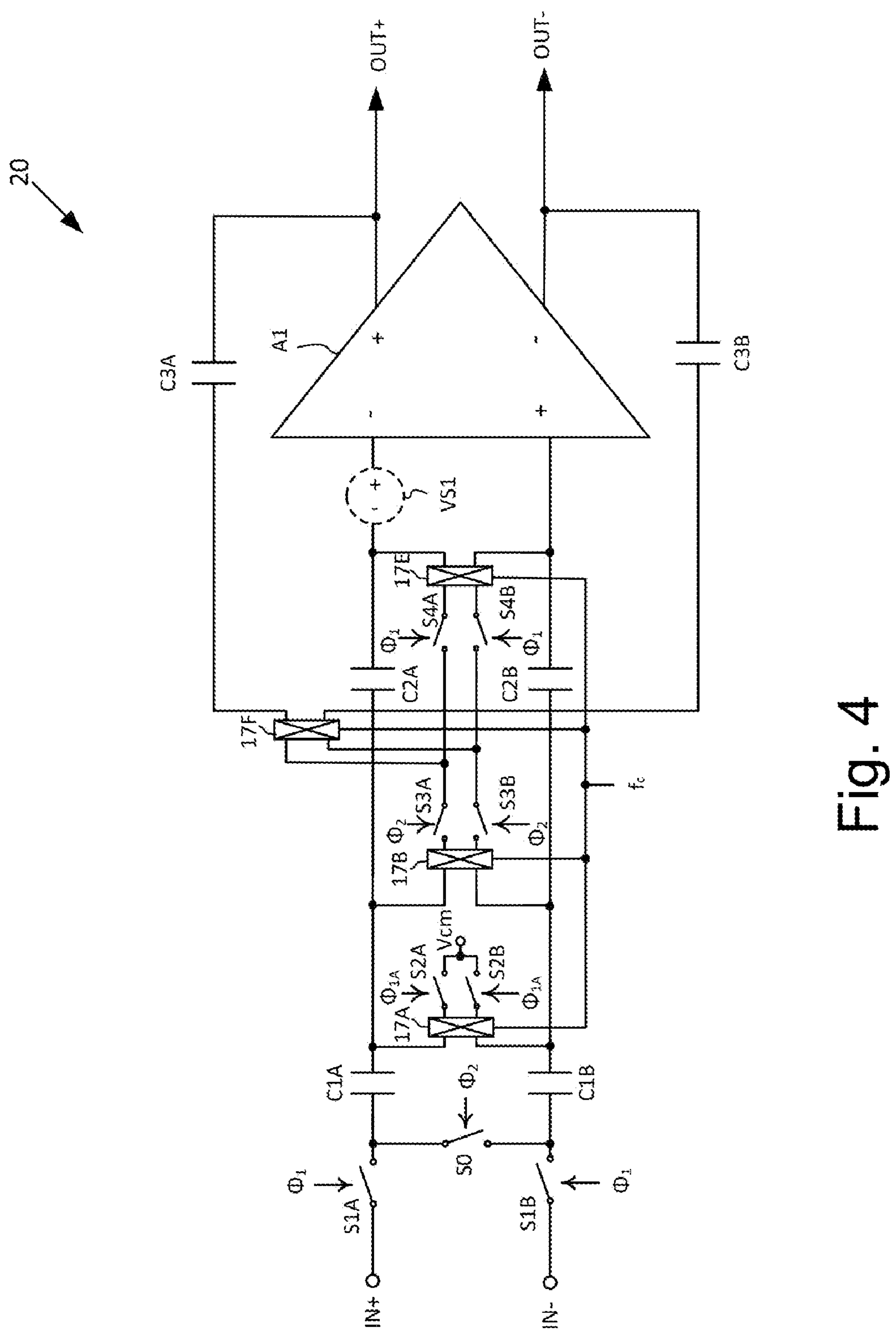
FIG. 4 is a simplified schematic diagram showing an example correlated double-sampling switched-capacitor integrator circuit 20, in accordance with another embodiment of the disclosure.

Referring to FIG. 4, a simplified schematic diagram showing an example correlated double-sampling switched-capacitor integrator circuit 20, in accordance with another embodiment of the disclosure. Example switched-capacitor integrator circuit 20 is identical to example switched-capacitor integrator circuit 10 of FIG. 3, so only differences between them are described below. Since choppers 17C and 17D only chop the circuit paths from feedback capacitors C3A, C3B to switches S3A, S3B and switches S4A, S4B, choppers 17C and 17D can be replaced by a single chopper 17F that chops connections to feedback capacitors C3A, C3B, resulting in a simplification over example integrator 10 of FIG. 3.

Figure 7:
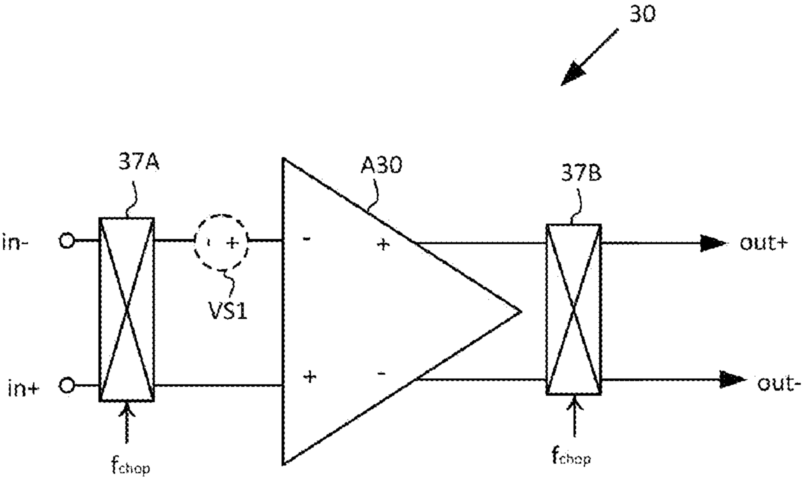
FIG. 7 is a simplified schematic diagram showing a prior art chopped circuit stage 30.

FIG. 7 is a simplified schematic diagram showing a prior art chopped circuit stage 30. An amplifier A30 has both input and output differential signal paths chopped by a pair of choppers 37A, 37B, which remove amplifier offset represented by voltage source VS1 as described above. As such, while amplifier offset is removed, offset due to charge injection asymmetry in choppers 37A, 37B will still be present.

Figure 8A:
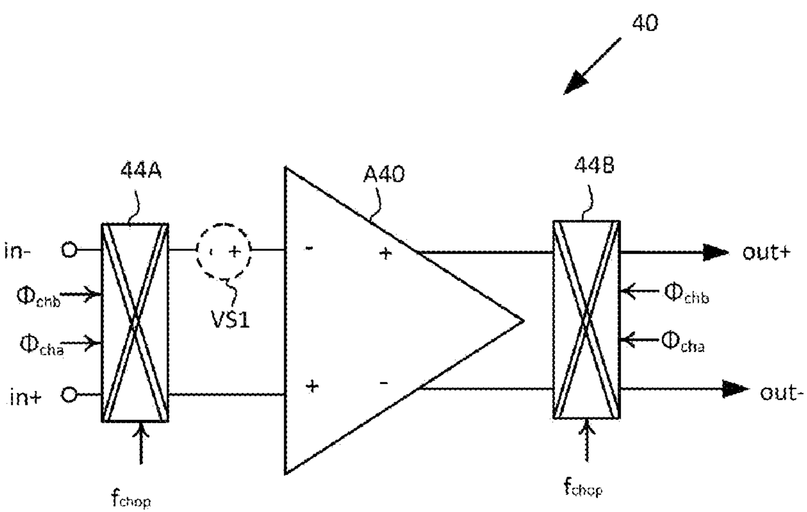
FIG. 8A is a simplified schematic diagram showing an example nested chopped circuit stage 40, in accordance with another embodiment of the disclosure.
Figure 8B:
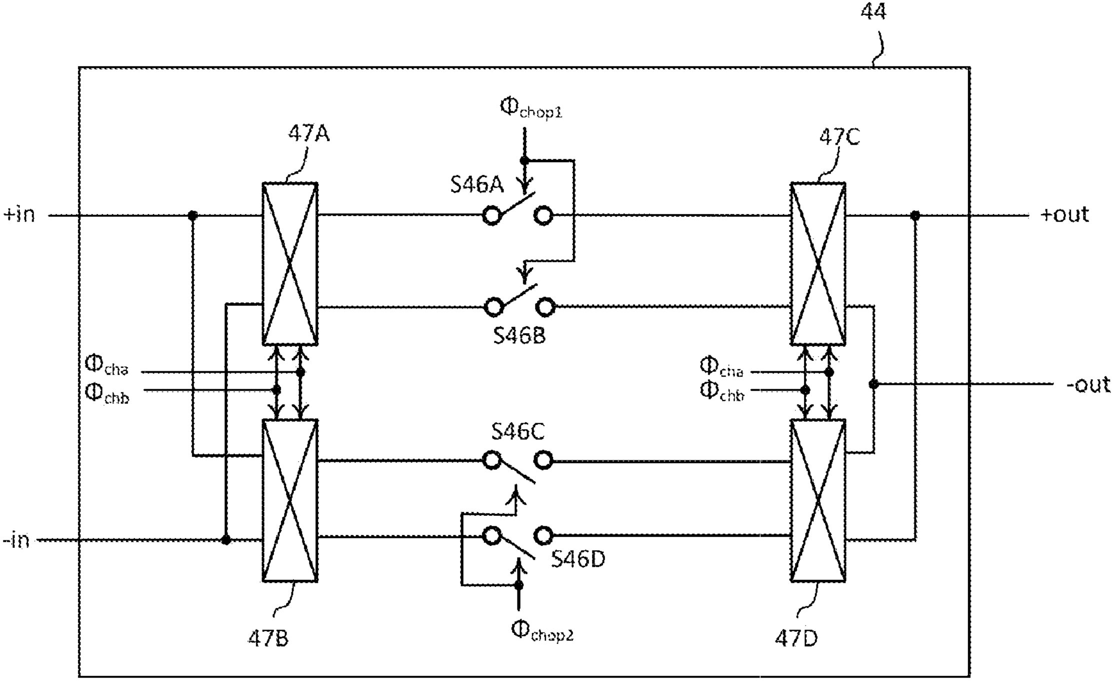
FIG. 8B is a simplified schematic diagram showing example details of a chopped chopper circuit 44 that may be used to implement chopped chopper circuits 44A and 44B in example nested chopped circuit stage 40 of FIG. 8B, in accordance with an embodiment of the disclosure.

Referring now to FIG. 8A, a simplified schematic diagram showing an example nested chopped circuit stage 40 is shown, in accordance with another embodiment of the disclosure. An amplifier A40 has both input and output differential signal paths chopped by a pair of modified choppers or "chopped choppers" 44A, 44B, which remove amplifier offset represented by voltage source VS1 as described above, but with modification in chopped choppers 44A, 44B, that also removes offset voltage due to asymmetric charge coupling in the primary chopping switches of chopped choppers 44A, 44B. FIG. 8B is a simplified schematic diagram showing example details of a chopped chopper circuit 44 that may be used to implement chopped chopper circuits 44A and 44B in example nested chopped circuit stage 40 of FIG. 8A, in accordance with an embodiment of the disclosure. A pair of choppers 47A, 47B, each operated with low-frequency chopping clock $f_c$ phases $\Phi_{cha}$, $\Phi_{chb}$, chop the individual input signal paths from inputs +in, −in to switch paths of a quad of switches S46A, S46B, S46C, S46D that perform the primary chopping action of chopped chopper circuit 44. Another pair of choppers 47C, 47D, each operated with low-frequency chopping clock $f_c$ phases $\Phi_{cha}$, $\Phi_{chb}$, chop the individual output signal paths from the switch paths of switches S46A, S46B, S46C, S46D to outputs +out, −out. Since the inputs to choppers 47A, 47B are connected directly through switch pair S46A, S46B and chopper 47C during high-frequency chopping clock phase $\Phi_{chop1}$, and since inputs to choppers 47A, 47B are connected directly through switch pair S46C, S46D and chopper 47D during high-frequency chopping clock phase $\Phi_{chop2}$, the interchange of the output connections of chopper 47D to outputs +out, −out causes the action of switches S46A, S46B, S46C, S46D to chop the differential signal path between inputs +in, −in and outputs +out, −out at the chopping frequency $f_{chop}$. As in the circuits of FIG. 3 and FIG. 4 as described above, chopping the switching paths of the primary chopper implemented by switches S46A, S46B, S46C, S46D shifts the offset due to charge injection asymmetry in switches S46A, S46B, S46C, S46D to a frequency away from DC.

In summary, this disclosure shows and describes differential switched-capacitor circuits and their methods of operation. In some embodiments, the differential switched-capacitor circuits may include one or more pairs of charge transfer switches operating at a sampling frequency, and an associated one or more pairs of capacitors coupled to the one or more pairs of charge transfer switches by a corresponding one or more quads of chopping switches. At least one of the pairs of charge transfer switches may have connections differentially interchanged by the corresponding quad of chopping switches operating at a frequency different from the sampling frequency to modulate charge injection through the charge transfer switches away from DC. In some embodiments, the reference sampling frequency may be a multiple of the second frequency, so that the quad of chopping switches averages the charge injection in half-periods of the second frequency and effectively subtracts injected charge in consecutive half-periods. In some embodiments, the reference sampling frequency may be a multiple greater than or equal to 100 of the chopping frequency.

In some embodiments, a differential switched-capacitor circuit may include a pair of capacitors, a switching circuit including a plurality of charge transfer switches that alternatively charge the pair of capacitors from a differential input in a first phase of a reference sampling clock and transfers charge from the pair of capacitors in a second phase of the reference sampling clock, and a chopping circuit that alternates connections to at least some of the switches of the switching circuit between differential pairs of signals through the switching circuit, wherein the chopping circuit is operated at a chopping frequency, whereby DC offset caused by charge-injection in the switching circuit due to the reference sampling clock coupling through the charge transfer switches of the switching circuit is removed by modulating the charge injection of the switching circuit away from DC. In some embodiments, the switching circuit may be an input circuit of a differential integrator or gain stage that accumulates the charge injection on a pair of feedback capacitors coupled between outputs and inputs of a differential amplifier to provide the DC offset, wherein the switching circuit transfers charge from the pair of capacitors to the pair of feedback capacitors of the differential integrator or gain stage.

In some embodiments, the pair of input sampling capacitors may be a first pair of input sampling capacitors, and the differential switched-capacitor circuit may further include a second pair of input sampling capacitors coupled to the first pair of input sampling capacitors. The switching circuit may charge the first pair of input sampling capacitors from the differential input and charge the second pair of input sampling capacitors from the inputs of the amplifier in the first phase of the reference sampling clock, and the charging of the first pair of input sampling capacitors and the second pair of input sampling capacitors may be referenced to a common-mode reference. The switching circuit may couple the second pair of input sampling capacitors in series with the amplifier inputs in the second phase of the reference sampling clock to remove amplifier offset, so that the differential switched-capacitor circuit provides correlated double-sampling operation. In some embodiments, the chopping circuit may include a first pair of quads of chopping switches that differentially interchange connections between a first pair of the charge transfer switches that couple the second pair of input sampling capacitors to the pair of feedback capacitors and a second pair of quads of chopping switches that differentially interchange connections between a second pair of the charge transfer switches that couple the first pair of input sampling capacitors and the second pair of input sampling capacitors to the pair of feedback capacitors during the second phase of the reference sampling clock.

In some other example embodiments, the chopping circuit may include a first quad of chopping switches that differentially interchanges connections between a first pair of the charge transfer switches that couple the second pair of input sampling capacitors to the pair of feedback capacitors during the first phase of the reference sampling clock, a second quad of chopping switches that differentially interchanges connections between a second pair of the charge transfer switches that couple the first pair of input sampling capacitors and the second pair of input sampling capacitors to the pair of feedback capacitors during the second phase of the reference sampling clock, and a third quad of chopping switches that differentially interchange connections between the feedback capacitors and connections between first quad of chopping switches and the second quad of chopping switches. In some example embodiments, the chopping circuit may include a pair of quads of chopping switches that differentially interchange connections between the pair of input sampling capacitors and a pair of charge transfer switches of the switching circuit that transfer the charge from the pair of input sampling capacitors during the second phase of the reference sampling clock. In some example embodiments, the chopping circuit may include a pair of quads of chopping switches that differentially interchange connections between the pair of input sampling capacitors and a pair of charge transfer switches that couple the pair of input sampling capacitors to a fixed voltage reference during a portion of the first phase of the reference sampling clock.

While the disclosure has shown and described particular embodiments of the techniques disclosed herein, it will be understood by those skilled in the art that the foregoing and other changes in form, and details may be made therein without departing from the spirit and scope of the disclosure. For example, the techniques shown above may be applied to other types of circuits having an offset that accumulates due to switch charge injection and/or signal edge coupling.

What is claimed is:

1. A differential switched-capacitor circuit, comprising:
two or more pairs of charge transfer switches operating at a sampling frequency; and
an associated two or more pairs of capacitors coupled to the two or more pairs of charge transfer switches by a corresponding two or more quads of chopping switches, wherein each terminal of the two or more pairs of charge transfer switches have connections differentially interchanged by the corresponding quad of chopping switches operating at a chopping frequency different from the sampling frequency to modulate charge injection through the two or more pairs of charge transfer switches away from DC.

2. The differential switched-capacitor circuit of claim 1, wherein the sampling frequency is a multiple of the chopping frequency, whereby the two or more quads of chopping switches average the charge injection in half-periods of the chopping frequency and effectively subtract injected charge in consecutive half-periods.

3. The differential switched-capacitor circuit of claim 2, wherein the sampling frequency is a multiple greater than or equal to 100 of the chopping frequency.

4. A method of reducing DC offset due to charge injection asymmetry in a differential switched circuit, the method comprising:
operating two or more pairs of charge transfer switches at a sampling frequency; and
coupling an associated two or more pairs of capacitors to the two or more pairs of charge transfer switches by a corresponding two or more quads of chopping switches, wherein each terminal of the two or more pairs of charge transfer switches have connections differentially interchanged by the corresponding quad of chopping switches operating at a chopping frequency different from the sampling frequency to modulate charge injection through the two or more pairs of charge transfer switches away from DC.

5. The method of claim 4, wherein the sampling frequency is a multiple of the second frequency, whereby the two or more quads of chopping switches average the charge injection in half-periods of the chopping frequency and effectively subtract injected charge in consecutive half-periods.

6. The method of claim 5, wherein the sampling frequency is a multiple greater than or equal to 100 of the chopping frequency.

7. A differential switched-capacitor circuit comprising:
a pair of input sampling capacitors;
a switching circuit including a plurality of charge transfer switches that alternatively charge the pair of input sampling capacitors from a differential input in a first phase of a reference sampling clock and transfer charge from the pair of input sampling capacitors in a second phase of the reference sampling clock; and
a chopping circuit that alternates connections to each terminal of at least some of the charge transfer switches of the switching circuit between differential pairs of signals through the switching circuit, wherein the chopping circuit is operated at a chopping frequency different from a frequency of the reference sampling clock, whereby a DC offset caused by charge-injection asymmetry in the differential switched-capacitor circuit due to the reference sampling clock coupling through the charge transfer switches of the switching circuit is removed by modulating a charge injection of the switching circuit away from DC.

8. The differential switched-capacitor circuit of claim 7, wherein a frequency of the reference sampling clock is a multiple of the second frequency, whereby the chopping circuit averages the charge injection in half-periods of the second frequency and effectively subtracts injected charge in consecutive half-periods.

9. The differential switched-capacitor circuit of claim 8, wherein the frequency of the reference sampling clock is a multiple greater than or equal to 100 of the chopping frequency.

10. The differential switched-capacitor circuit of claim 7, wherein the switching circuit is an input circuit of a differential integrator or gain-stage that accumulates the charge injection on a pair of feedback capacitors coupled between outputs and inputs of a differential amplifier, wherein the asymmetry in charge injection in the differential switched-capacitor circuit results in the DC offset, and wherein the switching circuit transfers charge from the pair of input sampling capacitors to the pair of feedback capacitors of the differential integrator or gain-stage.

11. The differential switched-capacitor circuit of claim 10, wherein the pair of input sampling capacitors is a first pair of input sampling capacitors, and further comprising a second pair of input sampling capacitors coupled to the first pair of input sampling capacitors, wherein the switching circuit charges the first pair of input sampling capacitors from the differential input and charges the second pair of input sampling capacitors from the inputs of the differential amplifier in the first phase of the reference sampling clock, wherein the charging of the first pair of input sampling capacitors and the second pair of input sampling capacitors is referenced to a common-mode reference, so that amplifier offset appears across the second pair of input sampling capacitors, and wherein the switching circuit couples the second pair of input sampling capacitors in series with the amplifier inputs in the second phase of the reference sampling clock to remove amplifier offset, whereby the differential switched-capacitor circuit provides correlated double-sampling operation.

12. The differential switched-capacitor circuit of claim 11, wherein the chopping circuit includes:
a first pair of quads of chopping switches that differentially interchange connections between a first pair of the charge transfer switches that couple the second pair of input sampling capacitors to the pair of feedback capacitors during the first phase of the reference sampling clock; and
a second pair of quads of chopping switches that differentially interchange connections between a second pair of the charge transfer switches that couple the first pair of input sampling capacitors and the second pair of input sampling capacitors to the pair of feedback capacitors during the second phase of the reference sampling clock.

13. The differential switched-capacitor circuit of claim 11, wherein the chopping circuit includes:
a first quad of chopping switches that differentially interchanges connections between a first pair of the charge transfer switches that couple the second pair of input sampling capacitors to the pair of feedback capacitors during the first phase of the reference sampling clock;
a second quad of chopping switches that differentially interchanges connections between a second pair of the charge transfer switches that couple the first pair of input sampling capacitors and the second pair of input sampling capacitors to the pair of feedback capacitors during the second phase of the reference sampling clock; and a third quad of chopping switches that differentially interchanges connections between the feedback capacitors and connections between the first quad of chopping switches and the second quad of chopping switches.

14. The differential switched-capacitor circuit of claim 7, wherein the chopping circuit includes a pair of quads of chopping switches that differentially interchange connections between the pair of input sampling capacitors and a pair of charge transfer switches of the switching circuit that transfer the charge from the pair of input sampling capacitors during the second phase of the reference sampling clock.

15. The differential switched-capacitor circuit of claim 7, wherein the chopping circuit includes a pair of quads of chopping switches that differentially interchange connections between the pair of input sampling capacitors and a pair of charge transfer switches that couple the pair of input sampling capacitors to a fixed voltage reference during a portion of the first phase of the reference sampling clock.

16. A method of reducing DC offset due to charge injection asymmetry in a differential switched-capacitor circuit, the method comprising:

operating the differential switched-capacitor circuit to sample a differential input signal with a pair of input sampling capacitors at a reference sampling frequency, whereby the DC offset is caused by edges of a first control operating the differential switched-capacitor circuit at the reference sampling frequency coupling through one or more charge transfer switches of the differential switched-capacitor circuit and accumulating to produce the DC offset, wherein the differential switched-capacitor circuit is a differential switched-capacitor integrator or gain-stage including a pair of input sampling capacitors, wherein the one or more charge transfer switches alternatively charge the pair of input sampling capacitors from a differential input in a first phase of a reference sampling clock and transfer charge from the pair of input sampling capacitors in a second phase of the reference sampling clock to a pair of feedback capacitors coupled between outputs and inputs of a differential amplifier; and chopping switching paths of each terminal of the one or more charge transfer switches to alternate connections of each terminal of the one or more charge transfer switches with a chopper operating at a chopping frequency different from the reference sampling frequency, wherein the chopper alternates connections to at least some of the one or more charge transfer switches between differential pairs of signals through the differential switched-capacitor circuit, whereby the chopper modulates the charge-injection of the one or more charge transfer switches away from DC.

17. The method of claim 16, wherein the reference sampling frequency is a multiple of the chopping frequency, whereby the chopper averages the charge injection in half-periods of the second frequency and effectively subtracts injected charge in consecutive half-periods.

18. The method of claim 17, wherein the reference sampling frequency is a multiple greater than or equal to 100 of the chopping frequency.

19. The method of claim 16, wherein the pair of input sampling capacitors is a first pair of input sampling capacitors, wherein the differential switched-capacitor integrator or gain-stage further includes a second pair of input sampling capacitors, and wherein the operating the differential switched-capacitor circuit comprises:

charging the first pair of input sampling capacitors from the differential input and charging the second pair of input sampling capacitors from the inputs of the differential amplifier during the first phase of the reference sampling clock, wherein the charging of the first pair of input sampling capacitors and the second pair of input sampling capacitors is referenced to a common-mode reference, so that amplifier offset appears across the second pair of input sampling capacitors; and coupling the second pair of input sampling capacitors to the inputs of the differential amplifier in the second phase of the reference sampling clock to remove the amplifier offset, whereby the differential switched-capacitor circuit provides correlated double-sampling operation.

20. The method of claim 19, wherein the chopping switching paths comprises:

differentially interchanging connections between a first pair of the one or more charge transfer switches that couple the second pair of input sampling capacitors to the pair of feedback capacitors during the first phase of the reference clock with a first pair of quads of chopping switches; and differentially interchanging connections between a second pair of the one or more charge transfer switches that couple the first pair of input sampling capacitors and the second pair of input sampling capacitors to the feedback capacitors during the second phase of the reference sampling clock with a second pair of quads of chopping switches.

21. The method of claim 19, wherein the chopping switching paths comprises:

differentially interchanging connections between each terminal of a first pair of the one or more charge transfer switches that couple the second pair of input sampling capacitors to the pair of feedback capacitors during the first phase of the reference clock with a first quad of chopping switches;

differentially interchanging connections between each terminal of a second pair of the one or more charge transfer switches that couple the first pair of input sampling capacitors and the second pair of input sampling capacitors to the pair of feedback capacitors during the second phase of the reference sampling clock with a second quad of chopping switches; and differentially interchanging connections between the feedback capacitors and connections between the first quad of chopping switches and the second quad of chopping switches with a third quad of chopping switches.

22. The method of claim 16, wherein the chopping switching paths comprises differentially interchanging connections between the pair of input sampling capacitors and ones of the one or more charge transfer switches that transfer the charge from the pair of input sampling capacitors during the second phase of the reference sampling clock with a pair of quads of chopping switches.

23. The method of claim 16, wherein the chopping switching paths comprises differentially interchanging connections between the pair of input sampling capacitors and a pair of the one or more charge transfer switches that couple the pair of the input sampling capacitors to a fixed voltage reference during a portion of the first phase of the reference sampling clock.

* * * * *